United States Patent [19]

Gilmore

[11] 4,027,146

[45] May 31, 1977

[54] HIGH SPEED ACCURATE LOW FREQUENCY COUNTER

[75] Inventor: Charles Minot Gilmore, Bridgman, Mich.

[73] Assignee: Heath Company, Benton Harbor, Mich.

[22] Filed: Mar. 23, 1976

[21] Appl. No.: 669,559

[52] U.S. Cl. .................. 235/151.31; 324/78 D; 324/79 D; 235/92 FQ

[51] Int. Cl.² ...................................... G01R 23/00

[58] Field of Search ...... 235/151.31, 92 FQ, 151.3; 324/78 R, 79 D, 106, 186, 78 D

[56] References Cited

UNITED STATES PATENTS

| | | | |
|---|---|---|---|
| 3,366,886 | 1/1968 | Dryden | 235/92 FQ |
| 3,518,540 | 6/1970 | Roberts | 324/79 D |
| 3,559,066 | 1/1971 | Pincus | 324/78 D X |
| 3,729,677 | 4/1973 | Band | 324/78 D |
| 3,829,785 | 8/1974 | Schroder et al. | 324/78 D |
| 3,909,716 | 9/1975 | Diekers | 324/78 D |
| 3,930,199 | 12/1975 | Valis | 324/78 D |
| 3,939,411 | 2/1976 | James | 324/78 D X |

Primary Examiner—Edward J. Wise
Attorney, Agent, or Firm—William R. Sherman; K. McMahon; Joseph J. Kaliko

[57] ABSTRACT

A frequency counter is disclosed which determines the frequency of an input signal in a high speed and accurate manner. High speed is achieved by utilizing electronic digital processing circuitry. The high degree of accuracy is achieved by a combination of elements which perform period averaging of an integral number of periods of the input signal over a flexible measurement interval. The counter is particularly useful in accurately measuring low frequency signals.

13 Claims, 5 Drawing Figures

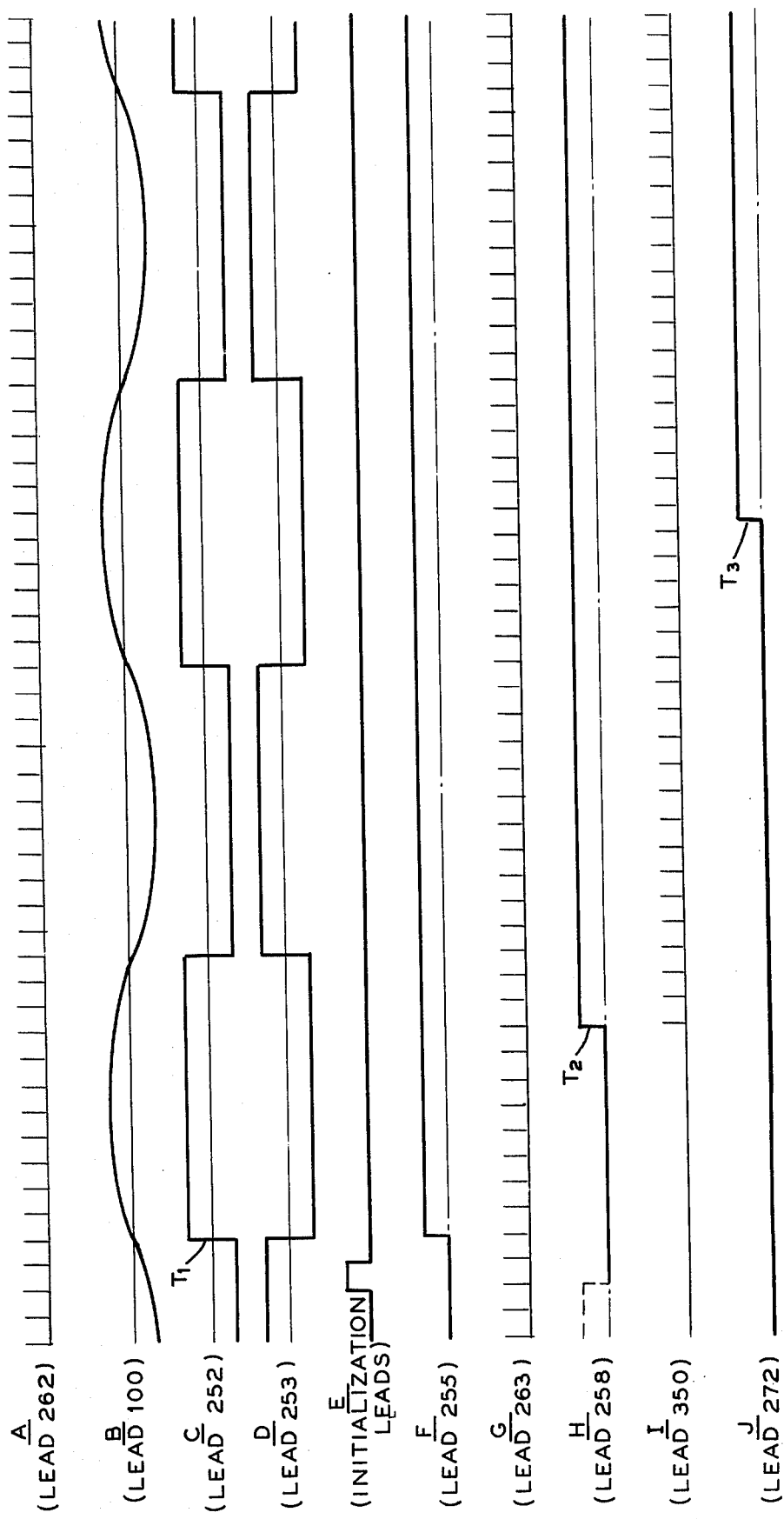

HIGH SPEED ACCURATE LOW FREQUENCY COUNTER

BACKGROUND OF THE INVENTION

This invention relates in general to systems for determining signal frequency. More particularly, this invention relates to a new and improved arrangement for measuring low frequency signals in a high speed and accurate manner.

DESCRIPTION OF THE PRIOR ART

A technique that has been widely employed to determine signal frequency is commonly referred to as the single period measurement technique. Since the frequency and period of a signal bear a reciprocal relationship, specifically:

Frequency = 1/Period frequency may be computed by first measuring the period of a single cycle of the signal. Single period measuring devices employing the above reciprocal relationship to calculate frequency are typified by Planta et al U.S. Pat. No. 3,537,003 issued Oct. 27, 1970.

A significant amount of error is often introduced when computing frequency via the single period measurement technique. This is because the accuracy of period measurement is highly affected by the signal to noise ratio of the signal being measured. As a result, multiple period averaging techniques have been developed to improve accuracy.

Period averaging and electronic conversion from period to frequency are combined in a number of instruments. Such instruments are typified by the frequency counter taught by Malbrain in U.S. Pat. No. 2,992,384 issued July 11, 1961 and the high speed frequency computing apparatus taught be McWaid in U.S. Pat. No. 3,524,131 issued Aug. 11, 1970. Instruments of this sort generally count pulses from a source for a fixed time interval and are most accurate in measuring high frequency signals. However, accuracy suffers when fixed time measurement insturments are used to measure low frequency signals. This is because with low frequency signals the number of pulses in a given sample is reduced. As a result, significant error is introduced on account of the fractions of cycles which may occure at the ends of a sample.

The Malbrain and McWaid patents cited hereinbefore are specifically addressed towards improving accuracy by utilizing the fractions of cycles which may result when pulse counting is performed during a fixed time interval. However, the utilization of fractional parts of the cycles to improve the accuracy of frequency measurement is not desirable. This is because slower unit response time and expensive, complicated circuitry, such as that shown in Malbrain and McWaid, are all byproducts of factoring fractions of cycles into the calculation of frequency.

Still another prior art approach for improving accuracy when measuring low frequency signals has been to increase the duration of sample time. Thus, for example, although the observation of a 30 cycle per second signal for 1 second will not measure a deviation of, for example, ¼ or ½ cycle. If the interval of observation is extended to 2 seconds the occurrance of 61 cycles would be registered to indicate a more accurate frequency of 30.5 cycles per second. Increasing the sample time is generally not desirable and in some cases not even feasible since it is generally required that electrical instrumentation systems of this type operate very rapidly.

Finally, frequency counters are known which perform period averaging over $10^N$ periods where N is selected apriori by the user. Decade multiples and submultiples of periods are required by these counters in order to simplify ultimate frequency calculation with a view towards achieving rapid output. An example of such a system is taught by Schmidhauser U.S. Pat. No 3,631,343 issued Dec. 28, 1971. Such systems which fix N apriori and restrict averages to decade multiples and submultiples of periods are problematic. The following example is set forth to help illustrate these problems.

Suppose that a 9 cycle per second signal were being sampled. N would have to be set equal to 0 or 1 in order to compute the frequency most efficiently. If N were set equal to 0 the result would be a single measurement sample and, as explained hereinbefore, much accuracy would be sacraficed. If N were set equal to 1 the sampling interval would far exceed one second which is frequently placed as an upper limit on such measurements. Still further, this approach lends itself to guesswork in that an educated guess at the frequency of the input signal must be made apriori by the user in order to select a reasonable value of N.

In view of the foregoing considerations, it may be appreciated that prior art frequency counters suitable for measuring low frequency signals have normally involved a compromise between accuracy, circuit complexity, speed of operation, and user guess-work. Therefore, a considerable need exists for a simplified frequency measuring system capable of measuring low frequency signals in a high speed, accurate, and guess-free manner.

It is therefore, an object of the invention to determine the frequency of an input signal in a high speed and highly accurate manner.

It is a further object of the invention to perform such measurements without having to rely on educated guesses by the user.

Further yet, it is an object of the invention to be able to perform such measurements with a relatively uncomplicated system which is particularly well suited for computing the frequency of low frequency signals.

SUMMARY OF THE INVENTION

According to the invention, rapid and accurate computation of the frequency of an input signal may be achieved by apparatus which performs period averaging and which guarantees that an integral number of periods of the input signal will be sampled over a flexible measurement interval. The elapsed time over the flexible measurement interval (T) together with the integral number of periods traversed (N) is utilized by the apparatus to compute the frequency of the input signal directly according to the formula Frequency = N/T. The use of a flexible measurement interval is what guarantees that N is always an integral number. Thus, according to the invention no fractions of cycles are ever involved when computing frequency.

The duration of the flexible measurement interval is determined as follows. To begin with, the flexible interval is partially defined by a first preselected time interval. According to the preferred embodiment of the invention, this first interval may be specified by the user. Both period counting and elapsed time measurement are made over this first interval which commences at an integral period boundry of the input signal. Upon expiration of the first interval a second preselected time interval begins. According to the preferred embodiment of the invention, this second interval may also be selected by the user. The apparatus continues measuring elapsed time during the second interval until either the second interval expires or an integral period boundry of the input signal is reached. The interval from the start of the first interval until an integral period boundry of the input signal is reached in the second interval is defined to be the flexible measurement interval.

Failure to detect an integral period boundary during the second interval is indicative of the input signal being of a frequency lower than the low frequency operating limit of the apparatus. According to the preferred embodiment of the invention, an error signal is generated in this case. The range of frequencies over which the device is operative may be altered by varying the duration of the second interval in a manner to be set forth in detail hereinafter.

Whenever an integral boundry is reached during the second interval the elapsed time measurement is "frozen." The number of periods counted (traversed) over the elapsed time is utilized to calculate frequency according to the formula set forth hereinbefore.

Accuracy of the frequency computation is assured. This is because the apparatus is guaranteed to terminate elapsed time measurement on an integral period boundry (during the second interval) for any input signal within the low frequency operating limit. Guaranteeing that the frequency may be computed from an integral number of periods allows the frequency computation to be performed at high speed with relatively simple "off-the-shelf" circuitry such as a calculator chip.

No apriori knowledge or guesswork by the user regarding the frequency of the input signal is required since the apparatus operates independent of the number of periods to be averaged.

Thus, the invention features highly accurate output particularly when measuring low frequency signals without sacrificing speed of operation or requiring user guess-work.

Further features of the invention include the ability to display the computed frequency digitally and to preprocess the calculated frequency prior to output so that the frequency ultimately displayed may be in user selected units such as cycles per second or revolutions per minute.

BRIEF DESCRIPTION OF THE DRAWINGS

These and other objects and features of the invention may be better understood from the following description given in connection with the accompanying drawing in which:

FIG. 5 shows wave forms illustrating the operation of the circuitry of FIG. 2 under error conditions.

DETAILED DESCRIPTION

Figure 1:
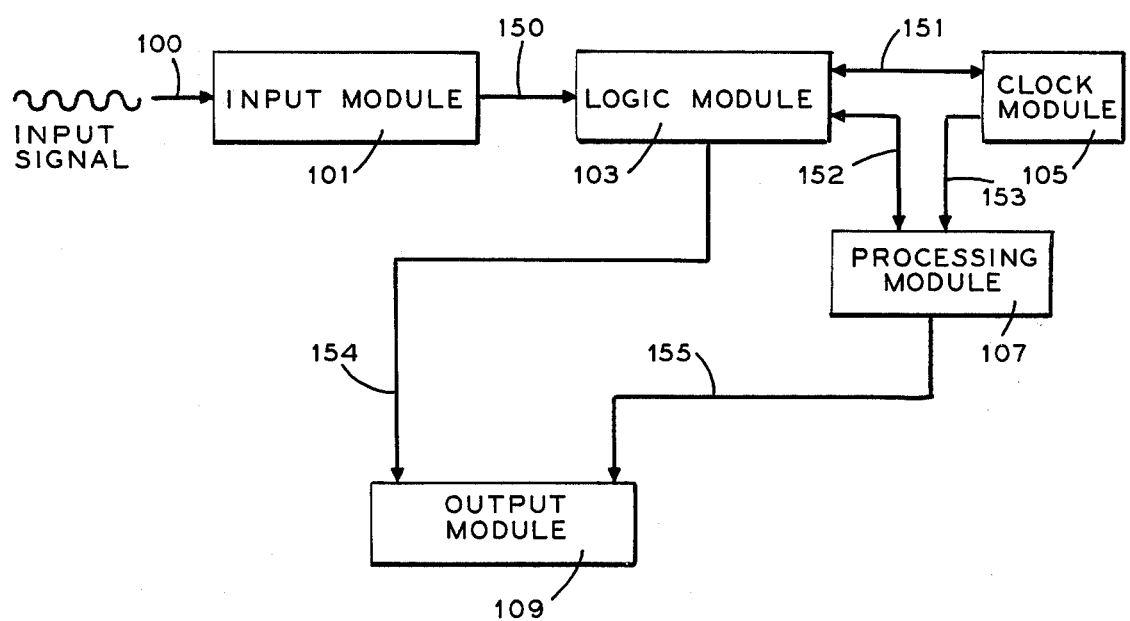
FIG. 1 shows a generalized block diagram depicting the functional interfaces of the various modules of a frequency counter built in accordance with the teachings of the present invention.

FIG. 1 comprises a block diagram depicting the functional interfaces of the various modules of a frequency counter built in accordance with the teachings of the present invention.

Starting with the top left-hand side of FIG. 1, lead 100 is shown energized by a periodic input signal oscillating at a frequency which is to be calculated. FIG. 1 also shows the signal on lead 100 being applied to Input Module 101.

Input Module 101 responds to an input periodic signal by outputting a series of trigger pulses. Each trigger pulse of the series corresponds to the beginning of a cycle of the periodic signal. These trigger pulses are utilized, as will be described in detail hereinafter, to keep track of the integral number of periods sampled. Additionally, the trigger pulses are utilized in initiating and terminating elapsed time measurement over a flexible measurement interval that is guaranteed to begin and end at integral period boundries. Finally, Input Module 101 is shown connected via lead 150 to Logic Module 103.

Before continuing with the functional description of the modules of the counter is should be understood that leads 150 to 155 (depicted in FIG. 1) are representative of functional module interfaces rather than physical module interconnections. The physical interconnection of modules, along with the structure of each module, will be set forth in detail hereinafter with reference to FIG. 2.

Returning to the functional description of the modules of FIG. 1. Logic Module 103 operates in response to the series of trigger pulses generated by Input Module 101 to accumulate a numerical representation, N, of the integral number of periods traversed over the flexible measurement interval. Logic Module 103 actually utilizes the trigger pulses referred to hereinbefore to initiate and terminate elapsed time measurement. Furthermore, Logic Module 103 guarantees that the elapsed time measurement begins and ends on an integral period boundry. Still further, Logic Module 103 is operative to detect error conditions and to output signals indicative of these conditions to Ouput Module 109 via lead 154.

Next, FIG. 1 shows Logic Module 103 connected to Clock Module 105 via bidirectional lead 151. Clock Module 105 is the module that actually measures elapsed time. The measurement is performed under the control of Logic Module 103. Logic Module 103 causes clock pulses generated within Clock Module 105 to be selectively gated and accumulated in, for example, an elapsed time register. The accumulated pulses constitute the elapsed time measure over the flexible interval.

Clock Module 105 is further operative to store a quantity representative of the length of a first preselected time interval over which the input signal is to be sampled. Module 105 continuously compares accumulated elapsed time with the quantity representing the length of the first interval. Clock Module 105 continuously outputs a signal to Logic Module 103 indicative of whether or not the first interval has expired. A second preselected time interval will immediately begin to run when Logic Module 103 receives the indication that the first interval has expired. It is within this second interval that Logic Module 103 will either exercise control over Clock Module 105 to terminate elapsed time measurement at an integral period boundry of the input signal or signal an error condition.

As indicated above, whenever an error is detected by Logic Module 103, an error signal is sent directly to Output Module 109 via lead 154. Output Module 109 may display the error in any one of any one of a number of ways such as by causing a lamp to be lit or a buzzer to be sounded.

Next, assume that no error condition is signaled by Logic Module 103, ie. that the elapsed time measurement has been terminated on an integral period boundry of the input signal within the second interval. The terminated elapsed time measure is hereinafter represented by the quantity T. Processing Moduel 107 is enabled by Logic Module 103 (via lead 152) once the value T is established. Actual frequency computation by Processing Module 107 may now begin.

Processing Module 107 performs frequency calculation by dividing the integral period count N by the interval over which the period count was performed, ie. N is divided by elapsed time T. N and T are supplied to Module 107 by Logic Module 103 (via lead 152) and by Clock Module 105 (via lead 153) respectively. The calculation is rapid and accurate since there are no fractions of cycles to contend with.

Finally, Processing Module 107 outputs the computed frequency to Output Module 109 via lead 155. As stated hereinbefore, the computed frequency may be further processed by Module 107 prior to output with the result that the frequency displayed by Output Module 109 is in user selected units.

What has been set forth above is a broad functional description of the various modules of a frequency counter built according to the teachings of the invention. A more detailed description will immediately follow setting forth the structure and interconnection of each and every module shown in FIG. 1.

Figure 2:
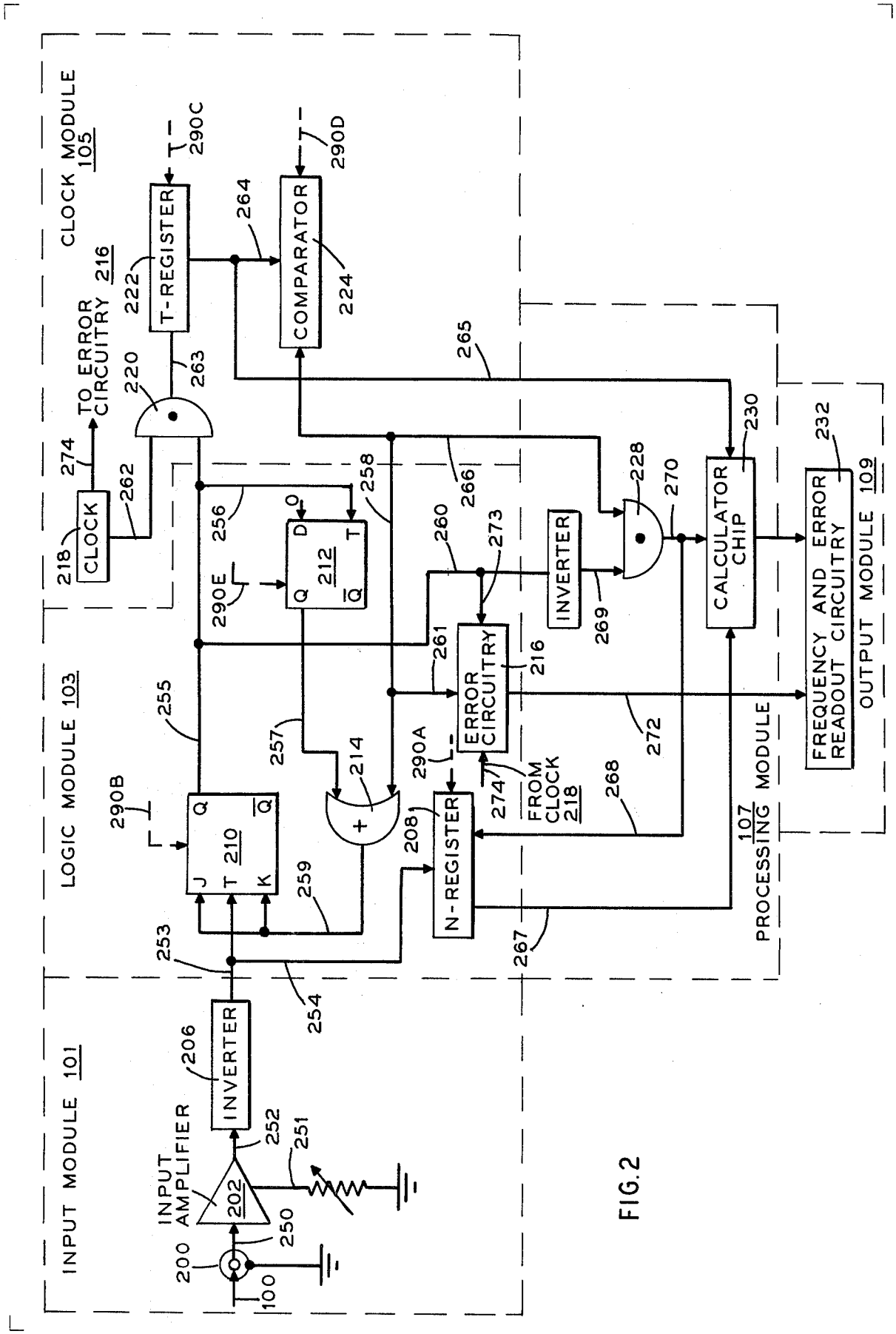
FIG. 2 shows the detailed circuitry and specific interconnections of the various modules of FIG. 1.

FIG. 2 displays the details of the structure and interconnection of all of the modules of FIG. 1.

Beginning at the top left-hand side of FIG. 2, labeled "Input Module 101," input lead 100 (also shown in FIG. 1) is depicted as connected to terminal 200. For the sake of illustration only, the input signal on line 100 is assumed to be a sinusoid. Terminal 200 of Input Module 101 is shown connected, via lead 250, to a Schmitt trigger arrangement comprised of input amplifier 202 and a trigger control 204 connected thereto via lead 251. Trigger control 204 permits adjustment of amplifier 202 so that an undesirable input, such as noise, is squelched.

The output from amplifier 202 is shown connected via lead 252 to inverter 206. According to the well known operation of a Schmitt trigger arrangement, a square wave output is produced on lead 252. Each leading edge of the square wave on lead 252 corresponds to the beginning of an integral period boundry of the input signal.

Inverter 206 of FIG. 2 inverts the square wave on lead 252 and outputs the inverted wave onto lead 253. Inverter 206 is employed in the preferred embodiment of the invention since it will be readily appreciated by those skilled in the art that the circuitry employed in later modules of the counter operate off of the trailing edge of a square wave. No inverter would be necessary if the circuitry following the trigger arrangement is designed to operate, for example, off of the leading edge of a square wave. What is important is that the circuitry following the trigger arrangement be responsive to signals indicated of integral period boundries of the input signals. Thus, it should be understood that the trailing edges of the square wave on lead 253 correspond to integral period boundries of the input signal.

The next portion of FIG. 2 to be discussed is the portion labeled "Clock Module 105." The circuiry of Clock Module 105 is shown in the upper right-hand portion of FIG. 2. According to the preferred embodiment of the invention, Clock Module 105 comprises high frequency clock 218, AND gate 220, elapsed time (T) register 222 and comparitor 224. Clock 218 is shown connected via lead 262 to AND gate 220. Gate 220 is selectively enabled by Logic Module 103 in a manner to be explained in detail hereinafter. At this point in the description all that need to be observed is that clock pulses from clock 218 are accumulated in T-register 222 when gate 220 is enabled. FIG. 2 displays T-register 222 connected to AND gate 220 via lead 263.

The elapsed time accumulated in T-register 222 is output via link 264 to comparitor 224. In addition to receiving continuously updated elapsed time information, comparitor 224 may be preset to compare the elapsed time with a quantity representing the length of a first preselected time interval over which sampling of the input signal is to occure.

Figure 3:
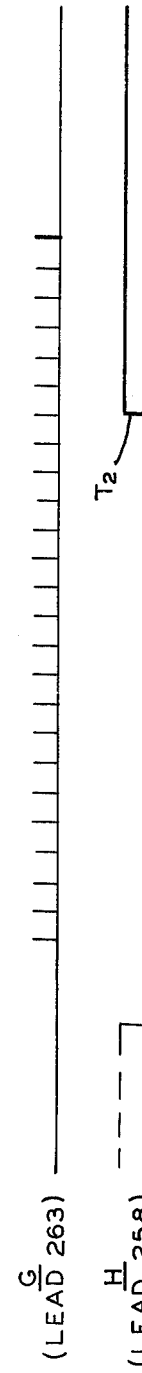
FIG. 3 shows the details of the error circuitry displayed in FIG. 2.

Diverging momentarily, according to the preferred embodiment of the invention, several of the devices displayed in FIGS. 2 and 3 require initialization. All dashed leads in FIGS. 2 and 3 indicate that a preset or clear operation has to be performed at frequency counter initializtion time which is defined hereinafter to be time $T_0$. This initialization time may be preset, user specified, etc., has no effect on the scope of the invention. Specific operations to be performed at time $T_0$ will be set forth hereinafter when reference is made to the particular device or circuit that needs to be initialized.

Returning to the description of Clock Module 105, dashed lead 290D is used to indicate that the quantity representing the first preselected time interval is input to comparitor 224 at time $T_0$. Comparitor 224 will change its output state on lead 258 whenever the elapsed time measure exceeds the quantity representing the length of the first interval. For the sake of illustration only, it is assumed that the output of comparitor 224 is cleared to zero at time $T_0$.

The next module to be examined is Logic Module 103. As indicated hereinbefore Logic Module 103 guarantees that period averaging commences and terminates on an integral period boundry. This is accomplished in the following manner.

As shown in FIG. 2, and in accordance with the preferred embodiment of the invention Module 103 is comprised of J-K flip-flop 210, D flip-flop 212 OR gate 214, period count (N) register 208 and error circuitry 216.

At $T_0$ flip-flop 210, flip-flop 212 and error circuitry 216 are all initialized. N-register 208, which is a trigger pulse counter, is initialized to −1 so that the initial trigger pulse received via leads 253 and 254 brings the count to zero. Observe that the second trigger pulse received after initialization will bump the count in register 208 to 1 thereby representing that a full cycle of the input signal has been traversed.

J-K flip-flop 210 is cleared (indicated by dashed lead 290B) at time $T_0$ so that the output on lead 255 is zero. As long as lead 255 is low, clock pulses from clock 218 are prohibited, by AND gate 220, from passing to T-register 222. This effectively guarantees that elapsed time calculation will not begin until the counter recognizes the first trigger pulse occurring at of after time $T_0$.

D flip-flop 212 is preset to output a 1 on lead 257 (as indicated by dashed lead 290E) at time $T_0$. This signal passes through OR gate 214 to J-K flip-flop 210 via lead 259. Whenever lead 259 is high, flip-flop 210 is permitted to toggle upon receipt of a trigger pulse over lead 253.

As indicated above, the first trigger pulse occurring at or after time $T_0$ starts elapsed time measurement. This happens to be the same trigger pulse that brings N-register 208 to a zero count. The time when these events occure will be referred to hereinafter as time $T_1$. At time $T_1$ the receipt of the trigger pulse over lead 253 causes the output state of flip-flop 210 (lead 255) to change to 1. Lead 255 being high enables AND gate 220 and thereby allows elapsed time to begin accumulating in T-register 222. Thus, elapsed time measurement is guaranteed to commence at an integral period boundry.

Coincident with lead 255 going high, D flip-flop 212 toggles. This is because the toggle terminal of flip-flop 212 is connected to lead 255 via lead 256. After flip-flop 212 toggles and until comparitor 224 outputs a 1 on lead 258, lead 259 will remain low inhibiting flip-flop 210 from toggling again.

Recall that comparitor 224 does not output a 1 on lead 258 until the expiration of the first preselected time interval. Thus, elapsed time is accumulated in T-register 222 over the entire first preselected time interval.

The point in time when the first preselected time interval expires is referred to hereinafter as time $T_2$. As explained above, J-K flip-flop 210 is enabled to toggle at time $T_2$. Enabled flip-flop 210 will only toggle upon receipt of the next trigger pulse on lead 253.

Turning attention briefly to error circuitry 216, it may be observed that coincident with lead 258 going high, circuitry 216 receives a 1 on lead 261. This is because lead 261 is connected to lead 258. Referring again to FIG. 3, it may be further observed that clock 218 is continuously fed into error circuitry 216 via link 274. Finally, it should be noted that lead 273 is input to error circuitry 216 and that lead 273 is high at time $T_2$. This is because flip-flop 210 is first armed to toggle at time $T_2$ and the output on lead 255, connected to lead 273 via lead 260, is still high. What all of this amounts to is that when lead 258 goes high at time $T_2$, gate 300 becomes enabled. Inturn, AND gate 300 being enabled allows elapsed time to start accumulating in T-register 2, shown as unit 302 in FIG. 3, from time $T_2$ on. It should be noted that unit 302 is cleared at time $T_0$ via lead 390A. It should be further noted that T-register 222 continues to accumulate elapsed time as it has done since time $T_1$.

Still focusing on error circuitry 216, it should be noted that comparitor 304 is preset at initialization so that lead 272 is low. comparitor 304 is also preset at $T_0$, as indicated by dashed lead 390B, to a quantity representative of a second preselected time interval. As indicated hereinbefore, the counter must observe a trigger pulse during this second interval or generate an error signal.

If a trigger pulse is observed during the second interval J-K flip-flop 210 toggles and lead 255 goes low. As a result error circuitry 216 is disabled by lead 273 going low. However, if not trigger pulse is observed during the second interval, J-K flip-flop 210 will not toggle and comparitor 304 will eventually output a 1 on lead 272. Lead 272 going high signifies the error condition.

An error signal output on lead 272 will be directly supplied to Output Module 109 where an error indication will be made via Frequency and Error Readout Device 232.

If not error is detected by error circuitry 216, ie. if lead 255 goes low in response to a trigger pulse (representing an integral period boundry) during the second interval, gate 220 is disabled and the quantity in T-register 222 is frozen. Thus, the elapsed time count in T-register 222 is guaranteed to terminate on an integral period boundry in the absence of an error condition.

It should be understood that an "error" condition as defined herein refers to trying to comtute the frequency of a signal which falls below the low frequency operating limit of the frequency counter. To vary the low frequency limit of the counter, one need only vary the length of the second preselected time interval as input to comparitor 304.

Turning attention to Procesing Module 107, it should be observed that AND gate 228 becomes fully enabled at the time when the first trigger pulse is generated by Input Module 101 during the second interval. This point in time is referred to hereinafter as time $T_t$. AND gate 228 is enabled at time $T_t$ because lead 266, which goes high at time $T_2$, remains high and because lead 269 goes high at time $T_t$. To explain further why lead 269 goes high at time $T_t$ recall that at $T_t$ flip-flop 210 toggles, lead 255 goes low, and Lead 260 connected thereto also goes low. Lead 260 is further connected to inverter 224 which inturn causes lead 269 to go high.

Thus, Processing Module 107 is enabled for the first time at time $T_t$ when the quantity in T-register 222 is frozen.

As soon as AND gate 228 is enabled, lead 270 goes high and lead 268 connected thereto goes high. Lead 268 is connected between lead 270 and N-register 208. Lead 268 is a count inhibit lead which, upon going high, freezes the contents of N-register 208. As may be deduced from the above, N-register 208 is frozen coincidently with the enabling of Processing Module 107. All of this takes place at time $T_t$.

Still further, lead 270 going high enables calculator chip 230. Calculator chip 230 is to perform the actual frequency calculation. According to the preferred embodiment, a calculator chip was chosen to do the frequency calculation because of its simplicity and ability to achieve results rapidly. The invention is not intended to be limited in any way to devices which calculate frequncy using calculator chips. For example, a microprocessor might just as well be utilized in place of chip 230 to compute $F=N/T$.

Continuing with the illustrative example, the frozen values N and T and input to chip 230, via leads 267 and 265 respectively, as soon as the chip is enabled. The frequency is then computed within the chip according to the above stated formula. Simplicity of calculation and rapid output are assured since no fractions of cycles of the input signal enter into the computation. The computed frequency is finally transmitted via lead 271 to Output Module 109.

Output Module 109 is shown comprised of Frequency and Error Readout Device 232. The preferred readout device displays the computed visually via a light-emitting diode array. As indicated above, many output module variations are possible. For example, audio output upon error detection or even printed computed frequency output are all user options and no particular readout device is to be construed as limiting the instant invention.

This completes the description of the frequency calculation process including the description of error handling.

In summary, the apparatus of FIG. 2 guarantees that frequency calculation may be performed over a flexible time interval, in particular interval $T_2$ minus $T_1$, where $T_1$ and $T_2$ occure at integral period boundries of the input signal.

Figure 4:
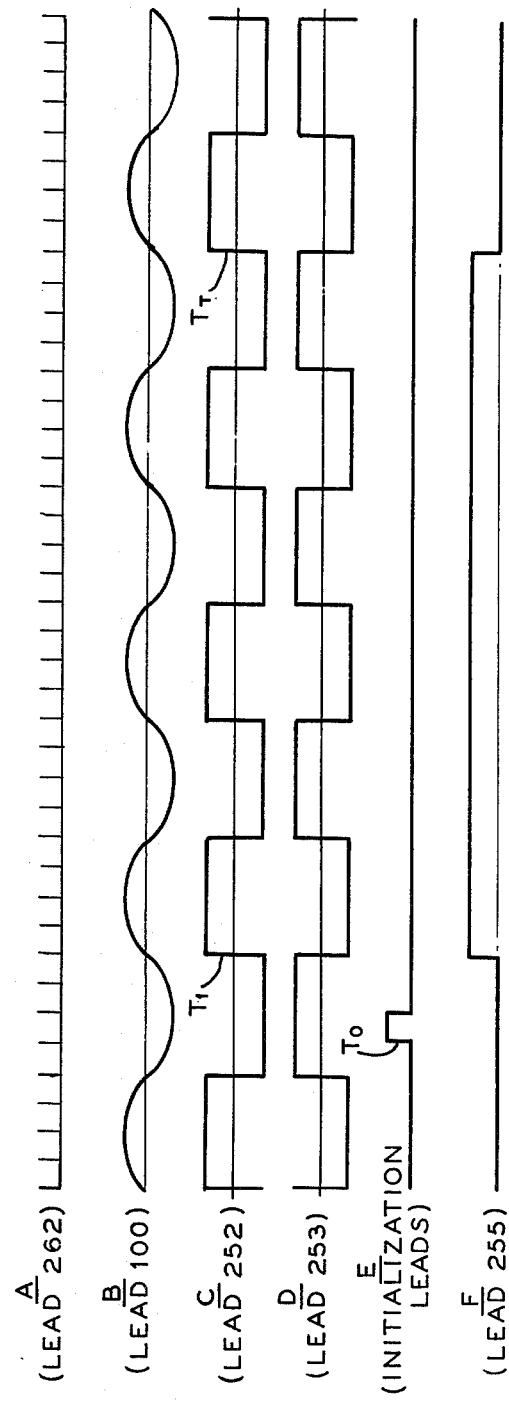
FIG. 4 shows wave forms illustrating the operation of the circuitry of FIG. 2 under normal operating conditions.

The operation of the frequency counter displayed in FIGS. 2 and 3 may now be summarized with reference to the wave forms displayed in FIGS. 4 and 5.

FIG. 4 summarizes the operation of the apparatus of FIG. 2 under normal operating conditions. FIG. 5 summarizes the operation of the apparatus of FIG. 2 under conditions where the input signal is lower than the low frequency operating limit of the counter. Lines A, B, etc. immediately referred to below are all displayed in FIG. 4.

Line A is representative of the clock pulses generated by high frequency clock 218. These clock pulses appear on lead 262 of FIG. 2.

Line B is representative of the sinusoidal input signal which, according to the illustrative example, is input to the frequency counter on lead 100. The frequency of this input signal is to be determined by the frequency counter.

Line C represents the square wave output of the Schmitt trigger arrangement and this wave form appears on lead 252 of FIG. 2. The leading edges of this square wave are each representative of the start of an integral period boundry of the input signal appearing on lead 100.

Line D shows the inverted square wave signal appearing on lead 253 of FIG. 2. The trailing edges of this signal comprise the series of trigger pulses referred to hereinbefore.

Line E represents initialization time $T_0$ and the pulse shown at time $T_0$ appears on the dashed leads in FIGS. 2 and 3 in order to clear and set various devices to the initial states indicated hereinbefore.

Line F shows the signal on lead 255, the output of J-K flip-flop 210. This lead is high from time $T_1$ until time $T_t$, ie. over the entire flexible measurement interval.

Line G is representative of the series of clock pulses that pass through AND gate 220 to lead 263 and eventually to T-register 222. T-register 222 accumulates these clock pulses in order to reflect the elapsed time over the flexible interval shown in Line F. Note that the elapsed time measure begins and ends on an integral period boundry of the input signal shown in Line B.

Finally, Line H depicts the signal on lead 258 which is the output of comparitor 224. It may be observed that lead 258 is cleared to zero at initialization time $T_0$ and that lead 258 goes high at time $T_2$ which is indicative of the start of the second preselected time interval. It should be noted that under these normal operating conditions, the trigger pulse following time $T_2$, ie. the pulse appearing at $T_t$, terminates the elapsed time count. Once again, the elapsed time measure is guaranteed to take place over an integral number of periods of the input signal.

The following line designations will all be made with reference to FIG. 5.

Line A corresponds to Line A of FIG. 4 and is again representative of clock 218 output.

Line B displays a low frequency signal on input lead 100. The particular signal displayed was chosen to be lower than the low frequency operating limit of the frequency counter so that the wave forms associated with the generation of an error signal could be examined in FIG. 5.

Line C is the squared version of the input signal as it appears on lead 252.

Line D is the inverse of the signal shown in Line C. Once again the trailing edges of this signal represent the series of trigger pulses which drive the rest of the counter circuitry.

Line E again displays an initialization point in time, $T_0$.

Line F represents the state of lead 255 at various points in time. It should be noted that lead 255 goes high at time $T_1$ but never goes low before the end of the second preselected time period represented by time $T_3$ (shown in Line J).

Line G shows the clock pulses that are accumulated after time $T_1$. These clock pulses appear on lead 263 and are accumulated in T-register 222.

Line H is representative of the state of lead 258 and shows this lead going high at time $T_2$. Recall that $T_2$ is the time at which the first preselected time interval expires.

Line I shows the clock pulses gated by gate 300 of error circuitry 216 to T-register-2, unit 302, of FIG. 3. Unit 302 accumulates these pulses to measure elapsed time over the second preselected time period.

Finally, Line J represents the error signal generated by error circuit 216 on line 272 at time $T_3$ when the second interval expires. Note that no trigger pulse (on Line D) occurs between time $T_2$ and $T_3$.

It will be readily observed by those skilled in the art that all of the circuitry displayed in FIGS. 2 and 3 may be obtained commercially as "off-the-shelf" items. Specifically, Schmitt trigger arrangements, inverter circuitry, J-K and D flip-flops, 2-input OR gates, and 2 and 3 input AND gates are all standard commercial products. T-register 222, T-register 2 (unit 303), and N-register 208 may all be realized with standard SN74160 counters. Comparitors 224 and 304 may be realized by standard SN7485 units. Finally, calculator chip 230 may be realized with a commerically available TMSO116 calculator chip.

What has been described above is just one embodiment of a frequency counter built in accordance with the teachings of the present invention. The modular approach displayed and described above has been used for the sake of illustration only, and is in no way intended to limit the scope of the invention. While one advantageous embodiment has been chosen to illustrate the invention, it will be understood by those skilled in the art that various changes and modifications can be made therein without departing from the scope of the invention as defined in the appended claims.

What is claimed is:

1. Apparatus for determining the frequency of an input signal by measuring an integral number of cycles of said input signals over a flexible measurement interval comprising:
- a. input means, including first generating means, for receiving said input signal and for generating a series of trigger pulses wherein each trigger pulse is representative of the start of a cycle of said input signal;
- b. clock means for providing an elapsed time signal representative of the duration of said flexible interval;
- c. logic means, connected to said input means, for providing a cycle count signal representative of the number of integral cycles of said input signal occurring during said flexible interval, wherein said cycle count signal is a function of the number of trigger pulses in said series; and
- d. processing means, including second generating means, connected to said clock means and to said logic means, for computing the frequency of said input signal as a function of said cycle count signal and said elapsed time signal and for generating a frequency measurement signal indicative of the computed frequency.

2. Apparatus as set forth in claim 1 wherein said clock means further comprises third generating means for generating a first signal whenever the elapsed time signal exceeds a first preselected time interval.

3. Apparatus as set forth in claim 2 wherein said logic means further comprises clock inhibit means, connected to said clock means, for inhibiting said clock means upon receipt of the trigger pulse following said first signal thereby guaranteeing that the flexible interval ends on an integral period boundry of said input signal.

4. Apparatus as set forth in claim 3 wherein said logic means further comprises error indication means for generating an error signal whenever no trigger pulse is detected by said logic means during a second preselected time interval that commences at the expiration of said first interval.

5. Apparatus as set forth in claim 1 wherein said processing means includes a calculator chip.

6. Apparatus as set forth in claim 1 wherein said output means further comprises one or more light emitting diodes for digitally displaying the computed frequency of said input signal.

7. A method for determining the frequency of a periodic input signal comprising the steps of:
- a. measuring elapsed time over an integral number of periods of said input signal to provide an elapsed time measure T;
- b. counting said integral number of periods to provide an integral period count N; and
- c. electronically computing the frequency of said input signal according to the formula Frequency=N/T.

8. A method for determining the frequency of a periodic input signal according to claim 7 which further comprises the step of displaying said electronically computed frequency.

9. A method for determining the frequency of a periodic input signal according to claim 7 which further comprises the step of generating an error signal whenever the frequency of said input signal is lower than a preselected low frequency limit.

10. A method for determining the frequency of a periodic signal over a flexible measurement interval comprises the steps of:
- a. inputting said periodic signal into a first generating means;
- b. generating a series of trigger pulses in response to said input signal wherein each trigger pulse of said series is representative of the start of a cycle of said periodic signal:
- c. accumulating elapsed time over said flexible measurement interval;
- d. generating an elapsed time signal representative of said accumulated elapsed time:
- e. generating a cycle count signal representative of the number of integral cycles of said input signal occurring during said flexible interval as a function of the number of trigger pulses in said series; and
- f. electronically calculating the frequency of said input signal as a function of said cycle count signal and said elapsed time signal.

11. A method as set forth in claim 10 wherein said step of accumulating elapsed time further comprises the steps of:
- a. generating the first signal upon the expiration of a first preselected time interval; and
- b. inhibiting the accumulation of elapsed time upon receipt of the trigger pulse following said first signal thereby guaranteeing that the flexible interval ends on an integral period boundry of said input signal.

12. A method as set forth in claim 11 further comprising the step of generating an error signal whenever no trigger pulse is detected during a second preselected time interval commencing with the generation of said first signal.

13. A method as set forth in claim 10 further comprising the steps of:
- a. outputting a frequency measurement signal indicative of said calculated frequency; and
- b. displaying the computed frequency value in response to said measurement signal.

* * * * *

UNITED STATES PATENT OFFICE
CERTIFICATE OF CORRECTION

Patent No. 4,027,146          Dated May 31, 1977

Inventor(s) Charles Minot Gilmore

It is certified that error appears in the above-identified patent and that said Letters Patent are hereby corrected as shown below:

Column 1, line 43, change "insturements" to --instruments--.
Column 4, line 30, change "is" to --it--.

Column 5, line 19, change "Moduel" to --Module--.
Column 6, line 39, after the word "etc.," insert --and--.
Column 6, line 60, change "OR" to --"OR"--.
Column 7, lines 23, 31, 34 and 46, change "l" to --"l"--.
Column 8, line 6, change "not" to --no--.
Column 8, line 8, change "l" to --"l"--.
Column 8, line 14, change "not" to --no--.
Column 8, line 28, change "Procesing" to --Processing--.
Column 9, line 5, after the word "computed" insert --frequency--

Signed and Sealed this

Eleventh Day of October 1977

[SEAL]

Attest:

RUTH C. MASON      LUTRELLE F. PARKER
*Attesting Officer*      *Acting Commissioner of Patents and Trademarks*